US008222065B1

(12) United States Patent
Smeys et al.

(10) Patent No.: US 8,222,065 B1
(45) Date of Patent: Jul. 17, 2012

(54) METHOD AND SYSTEM FOR FORMING A CAPACITIVE MICROMACHINED ULTRASONIC TRANSDUCER

(75) Inventors: Peter Smeys, Mountain View, CA (US); Peter Johnson, Sunnyvale, CA (US); Gokhan Percin, Los Gatos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 172 days.

(21) Appl. No.: 12/587,139

(22) Filed: Oct. 2, 2009

(51) Int. Cl.
*H01L 29/72* (2006.01)
(52) U.S. Cl. .......... 438/51; 438/381; 438/393; 438/396; 600/459; 257/416
(58) Field of Classification Search .................. 257/416; 438/51, 381, 393, 396; 600/459
See application file for complete search history.

(56) References Cited

U.S. PATENT DOCUMENTS

2006/0075818 A1* 4/2006 Huang et al. ..................... 73/649

OTHER PUBLICATIONS

Xuefeng Zhuang, et al., "Wafer-Bonded 2-D CMUT Arrays Incorporating Through-Wafer Trench-Isolated Interconnects with a Supporting Frame", IEEE Transactions on Ultrasonics, Ferroelectrics and Frequency Control, vol. 56, No. 1, Jan. 2009, p. 182-192.

Y. Huang, et al., "Fabricating Capacitive Micromachined Ultrasonic Transducers with Wafer-Bonding Technology", 5 pages.

K. K. Park, et al., "Fabricating Capacitive Micromachined Ultrasonic Transducers with Direct Wafer-Bonding and Locos Technology", MEMS 2008, Tucson, AZ, USA, Jan. 13-17, 2008, p. 339-342.

Steven J. Adler, et al., "Method of Forming a Capacitive Micromachined Ultrasonic Transducer (CMUT) and Related Apparatus", U.S. Appl. No. 12/589,754, filed Oct. 28, 2009.

* cited by examiner

*Primary Examiner* — Edward Wojciechowicz
(74) *Attorney, Agent, or Firm* — Eugene C. Conser; Wade J. Brady, III; Frederick J. Telecky, Jr.

(57) ABSTRACT

A method for forming a capacitive micromachined ultrasonic transducer (CMUT) is provided that includes forming oxide features outwardly of a CMUT control chip in a silicon wafer. The oxide features are planarized. A silicon-on-insulator (SOI) wafer is bonded to the planarized oxide features. For a particular embodiment, the SOI wafer comprises a single crystal epitaxial layer, a buried oxide layer and a silicon layer, and the single crystal epitaxial layer is bonded to the planarized oxide features, after which the silicon layer and the buried oxide layer of the SOI wafer are removed, leaving the single crystal epitaxial layer bonded to the oxide layer.

20 Claims, 4 Drawing Sheets

METHOD AND SYSTEM FOR FORMING A CAPACITIVE MICROMACHINED ULTRASONIC TRANSDUCER

TECHNICAL FIELD

This disclosure is generally directed to integrated circuit fabrication. More specifically, this disclosure is directed to a method and system for forming a capacitive micromachined ultrasonic transducer.

BACKGROUND

Capacitive micromachined ultrasonic transducers (CMUTs) have been increasingly used in medical imaging applications. For example, CMUTs have been able to improve medical ultrasound imaging probes and to provide high-intensity focused ultrasound for use in medical therapy.

Originally, CMUTs were produced using a typical MEMS manufacturing technique in which a release layer is etched out, leaving a free-standing membrane. Such CMUT devices can be produced directly on a silicon substrate or on top of the control circuitry.

An alternative CMUT process involves the bonding of a silicon-on-insulator (SOI) wafer. This wafer is used to form a single crystal silicon membrane after the handle wafer and the buried oxide layer are stripped. The benefits of this approach are process simplicity and the higher Q of the single crystal Silicon membrane. Such CMUTs can be produced as stand alone devices but cannot be easily integrated on top of the support circuitry. Although the metal interconnect layers of the support circuitry afford the opportunity of easily contacting the bottom CMUT electrodes, the primary challenge is producing a coplanar surface on which the SOI wafer is subsequently bonded. Even in the case where the CMUT is produced on a silicon substrate, contact to the bottom electrodes has been problematic. Conventional methods for providing such contact involve the use of through-silicon vias (TSVs). However, the use of TSVs requires multiple process steps including deep silicon etching using a Bosch etch process, which is relatively slow and expensive.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1A:
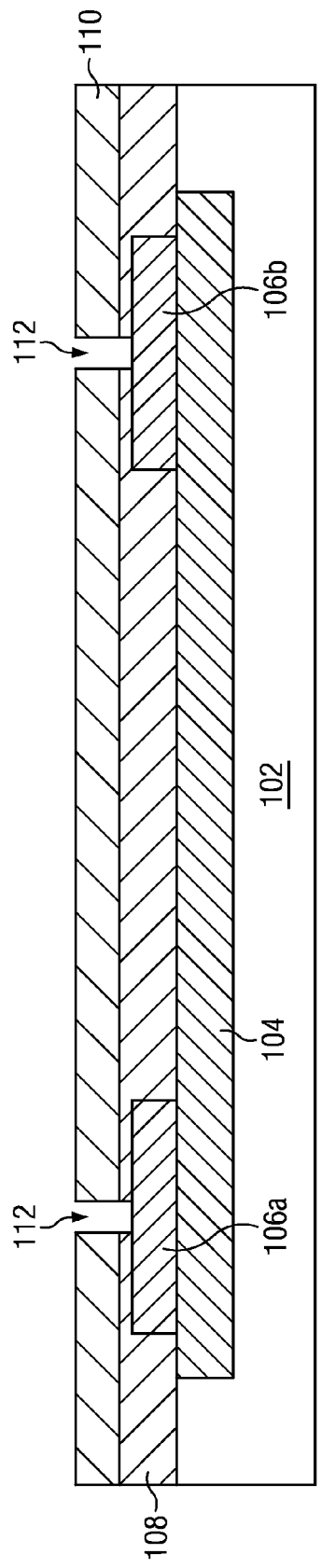
FIGS. 1A-F are a series of diagrams illustrating the integrated circuit fabrication steps for forming a capacitive micromachined ultrasonic transducer (CMUT) on a semiconductor wafer in accordance with one embodiment of this disclosure.
Figure 1B:
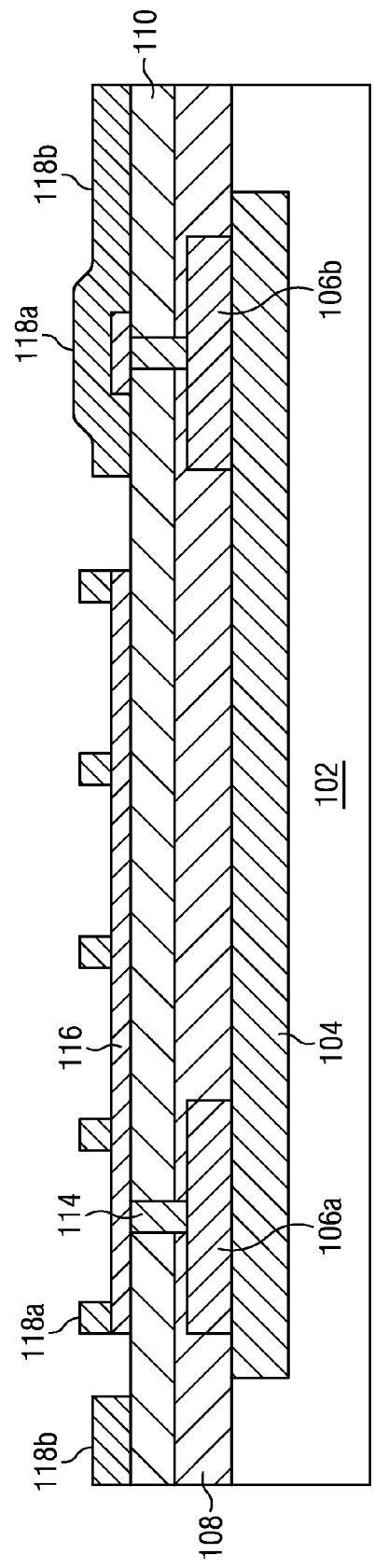
Figure 1C:
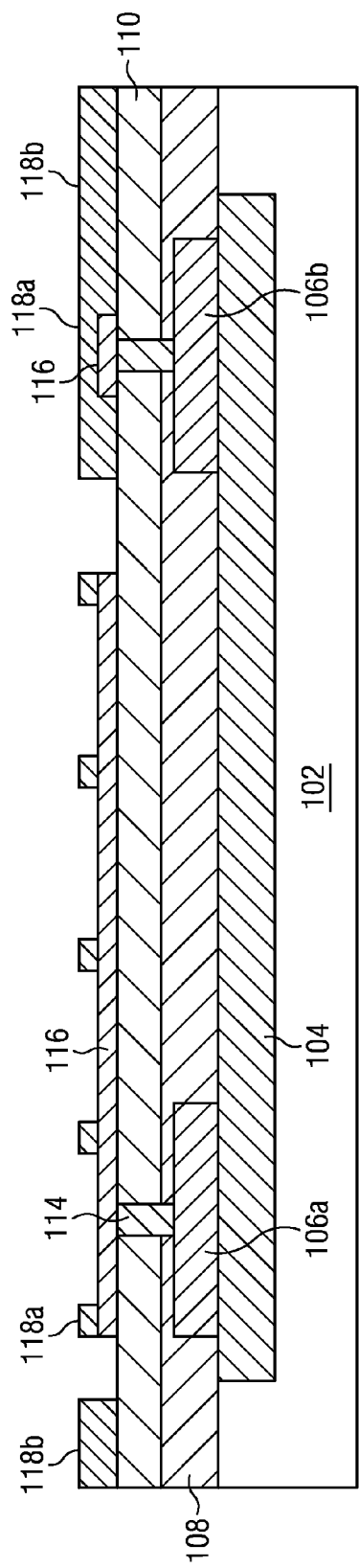
Figure 1D:
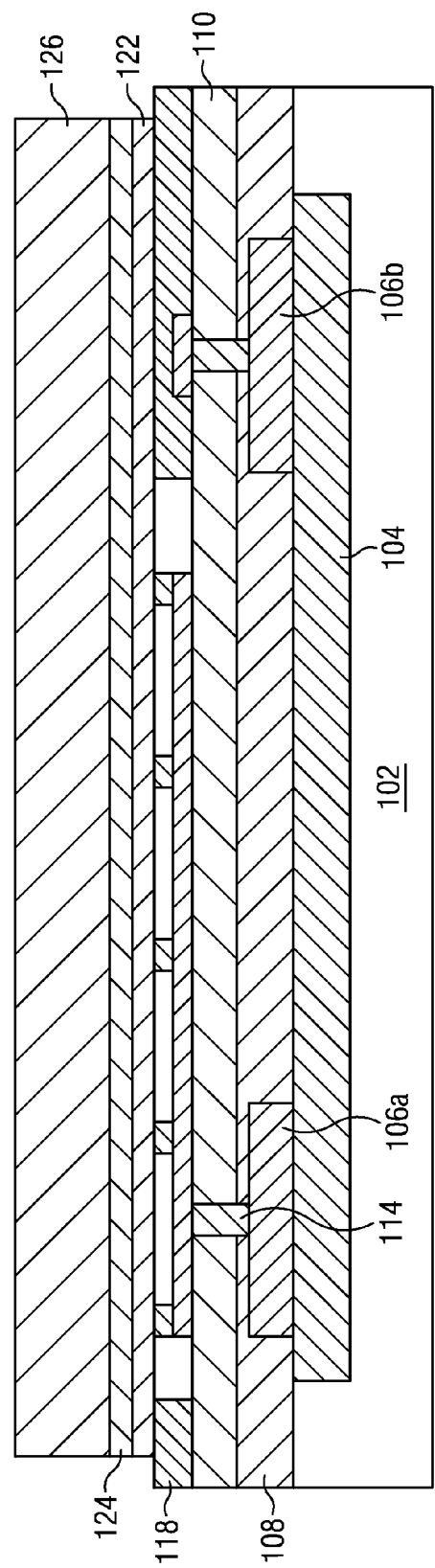
Figure 1E:
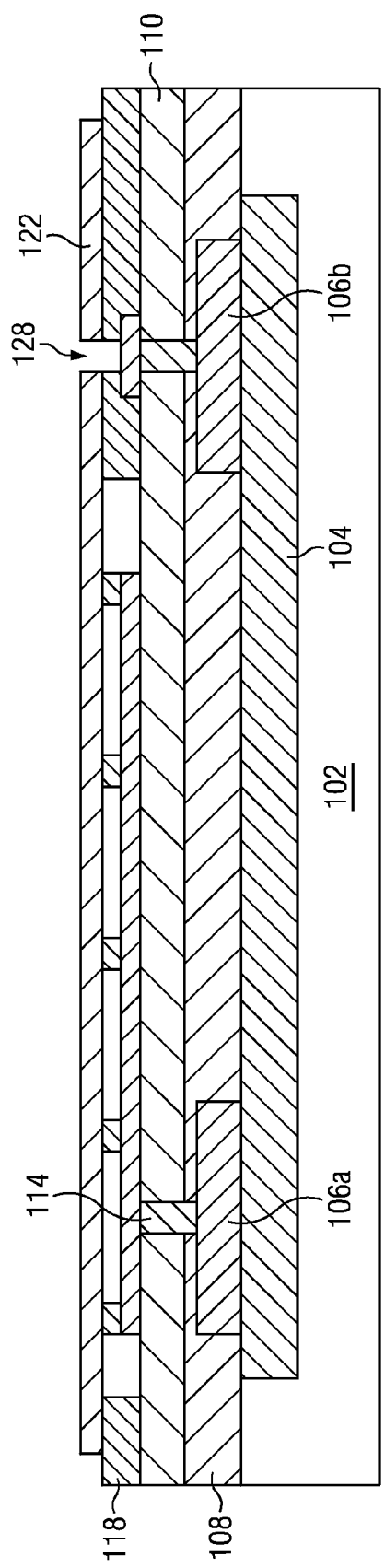
Figure 1F:
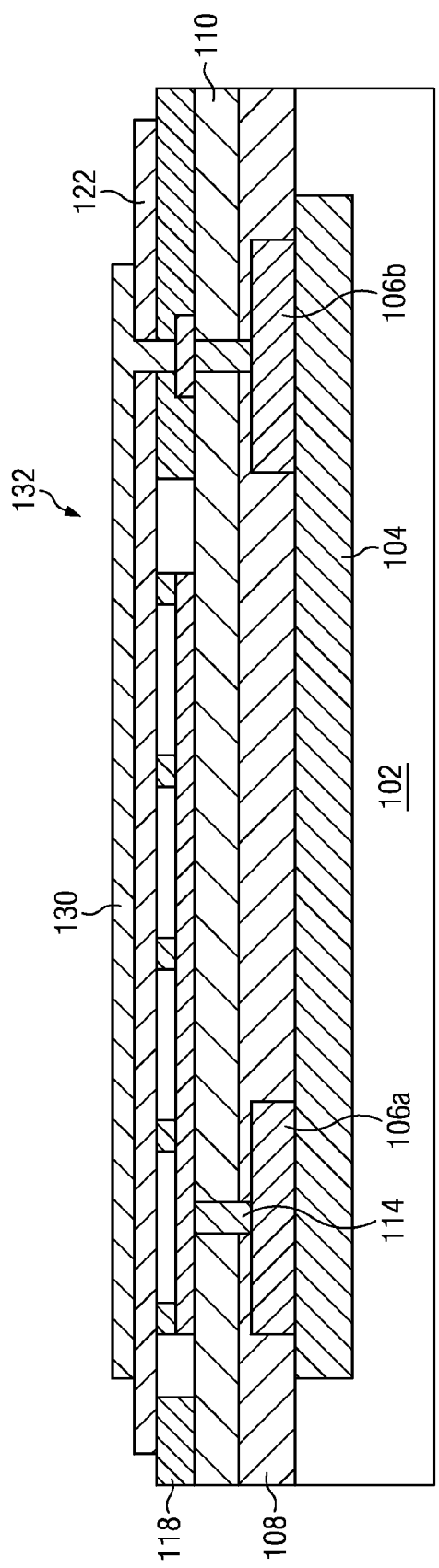
Figure 2:
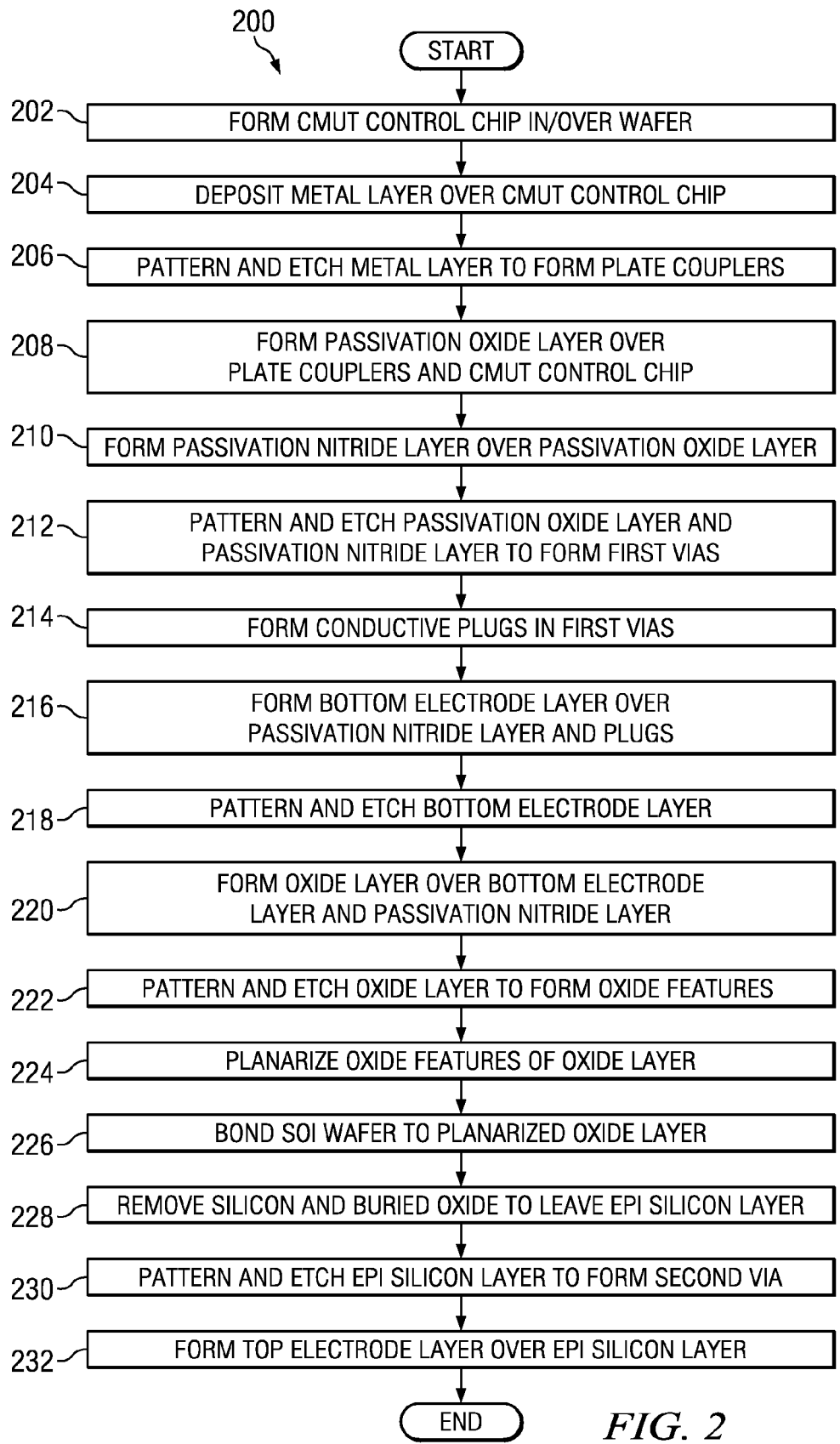
FIG. 2 is a flow diagram illustrating a method for forming a CMUT on a semiconductor wafer in accordance with one embodiment of this disclosure.

FIGS. 1-2, discussed below, and the various embodiments used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

FIGS. 1A-F are a series of diagrams illustrating the integrated circuit fabrication steps for forming a capacitive micromachined ultrasonic transducer (CMUT) on a semiconductor wafer in accordance with one embodiment of this disclosure. As shown in FIG. 1A, the semiconductor wafer comprises a CMUT control chip device wafer 102, which is a silicon wafer in which a CMUT control chip 104 may be processed. The CMUT control chip 104 is capable of driving the transmit/receive and addressing circuitry for the CMUT.

For some embodiments, a CMUT array element comprises a plurality of cells or membranes. For these embodiments, multiple connections to the control chip 104 could be processed. However, for simplicity, the following description refers to a single cell. In addition, the final device could comprise a plurality of array elements, with each element having its own isolated electrical contact from the control chip 104.

As shown in FIG. 1A, a top metal layer 106 is deposited over the control chip 104. The top metal layer 106 may be formed using any suitable deposition technique. For a particular embodiment, the top metal layer 106 may comprise a stack of Ti+TiN+AlCu+TiN with a stack thickness of about 10000 Å. However, it will be understood that the top metal layer 106 may comprise any suitable conductive material of any suitable thickness.

The top metal layer 106 illustrated in FIG. 1A has been patterned and etched using any suitable photolithography and etch or other technique. The top metal layer 106 is patterned to provide an electrical coupling between the CMUT capacitor plates and the control chip 104. Thus, for the illustrated embodiment, the top metal layer 106 has been patterned to provide a bottom plate coupler 106a, which will electrically couple a bottom plate of the capacitor to the control chip 104, and a top plate coupler 106b, which will electrically couple a top plate of the capacitor to the control chip 104.

A passivation oxide layer 108 is deposited over the CMUT control chip device wafer 102, the CMUT control chip 104, and the patterned top metal layer 106. The passivation oxide layer 108 may be formed using any suitable deposition technique. For a particular embodiment, the passivation oxide layer 108 may comprise a high density plasma (HDP) oxide. However, it will be understood that the passivation oxide layer 108 may comprise any suitable oxide.

The passivation oxide layer 108 is planarized. For a particular embodiment, an oxide chemical mechanical polish (CMP) may be performed to planarize the passivation oxide layer 108. For a particular embodiment, the planarized passivation oxide layer 108 may comprise a thickness of about 6500 Å. However, it will be understood that the planarized passivation oxide layer 108 may comprise any suitable thickness.

A passivation nitride layer 110 is deposited over the planarized passivation oxide layer 108. The passivation nitride layer 110 may be formed using any suitable deposition technique. For a particular embodiment, the passivation nitride layer 110 may comprise a plasma nitride with a thickness of about 6000 Å. However, it will be understood that the passivation nitride layer 110 may comprise any suitable nitride and any suitable thickness.

Vias 112 are formed, such as by etching, through the passivation nitride layer 110 and the passivation oxide layer 108 to the top metal layer 106. These vias 112 provide access to the couplers 106a and 106b in order to form the electrical coupling of the CMUT capacitor plates to the control chip 104.

As shown in FIG. 1B, the vias 112 are filled with any suitable conductive plugs 114. For a particular embodiment, a standard tungsten (W) plug process may be used to fill the vias 112. For this embodiment, the vias 112 may be essentially the same diameter in order to facilitate the W plug process. However, it will be understood that the vias 112 may be filled in any suitable manner. Bond pad connections to the control chip 104 may not be open at this time, but they could be opened at the end of the process after the CMUT transducer is completed.

A bottom electrode layer 116 is deposited over the passivation nitride layer 110 and the plugs 114 such that good electrical contact is made to the plugs 114. The bottom electrode layer 116 may be formed using any suitable deposition technique. For some embodiments, the bottom electrode layer 116 may comprise a metal stack with a thickness of about 2000 Å. However, it will be understood that the bottom electrode layer 116 may comprise any suitable conductive material of any suitable thickness.

For a particular embodiment, the bottom electrode layer 116 may comprise about 300 Å of titanium (Ti) and about 1700 Å of titanium nitride (TiN). For this embodiment, the 300 Å Ti layer may be deposited following a sputter etch pre-clean in order to make good electrical contact between the bottom electrode layer 116 and the plugs 114. In order to avoid localized high electric field regions that may result in issues with collapse voltage and poor capacitor matching, the bottom electrode layer 116 may be formed in such a manner as to be relatively smooth. A smooth composite stack of Ti and TiN may be suitable for this purpose. In addition, with proper process control, other metal film stacks may be implemented. For example, a stack of Ti and aluminum (Al) may be used as one alternative.

The bottom electrode layer 116 illustrated in FIG. 1B has been patterned and etched using any suitable photolithography and etch or other technique. The bottom electrode layer 116 is patterned such that a larger portion of the bottom electrode layer 116 will form the bottom electrode of the capacitor and is thus coupled to the bottom plate coupler 106a, while a smaller portion of the bottom electrode layer 116 may be coupled to the top plate coupler 106b.

An oxide layer 118 is deposited over the passivation nitride layer 110 and the bottom electrode layer 116. The oxide layer 118 may be formed using any suitable deposition technique. For a particular embodiment, the oxide layer 118 may comprise a plasma oxide with a thickness of about 5000 Å. However, it will be understood that the oxide layer 118 may comprise any suitable oxide of any suitable thickness.

The oxide layer 118 illustrated in FIG. 1B has been patterned and etched using any suitable photolithography and etch or other technique to provide oxide features. However, the patterned oxide layer 118 does not provide coplanar oxide features. Instead, a first set of oxide features 118a that is formed over the bottom electrode layer 116 is higher than a second set of oxide features 118b that is formed directly over the passivation nitride layer 110. For the embodiment described above, for example, the first set of oxide features 118a is about 2000 Å higher than the second set of oxide features 118b.

As shown in FIG. 1C, the oxide features 118a and 118b are coplanar. For some embodiments, planarization is provided by fly cutting the oxide features 118a and 118b. For a particular embodiment, a fly cutting tool manufactured by DISCO CORPORATION may be used to globally planarize the oxide features 118a and 118b. In addition, the planarized oxide features 118a and 118b may comprise a thickness of about 2000 Å over the bottom electrode layer 116. However, it will be understood that the planarized oxide features 118a and 118b may comprise any suitable thickness.

As shown in FIG. 1D, a silicon-on-insulator (SOI) wafer 120 is bonded onto the patterned oxide layer 118. The SOI wafer 120 may comprise a single crystal epitaxial (Epi) silicon layer 122, a buried oxide layer 124, and a silicon layer 126. Thus, for this embodiment, the Epi silicon layer 122 is bonded onto the coplanar, patterned oxide layer 118. For some embodiments, the Epi silicon layer 122 may comprise a thickness of about 0.1-1.0 μm. However, it will be understood that the Epi silicon layer 122 may comprise any suitable thickness.

As shown in FIG. 1E, the buried oxide layer 124 and the silicon layer 126 of the SOI wafer 120 are removed. For example, the silicon layer 126 may be ground back partially, followed by a wet etch of the remaining silicon to expose the buried oxide layer 124. The buried oxide layer 124 may then be stripped, leaving the single crystal Epi silicon layer 122 bonded to the oxide layer 118.

The Epi silicon layer 122 is patterned and etched to form a via 128 through the Epi silicon layer 122 and the oxide layer 118 to the bottom electrode layer 116. Thus, the via 128 provides access to the top plate coupler 106b through the bottom electrode layer 116 and one of the plugs 114.

As shown in FIG. 1F, a top electrode layer 130 is deposited over the Epi silicon layer 122 and into the via 128. The top electrode layer 130 may be formed using any suitable deposition technique. For a particular embodiment, the top electrode layer 130 may comprise a Ti and TiN stack of about 2000 Å. However, it will be understood that the top electrode layer 130 may comprise any suitable conductive material of any suitable thickness.

As shown in FIG. 1F, an integrated circuit device 132 is formed that comprises both the CMUT sensor (i.e., the Epi silicon layer 122) and the CMUT control chip 104. At this point, an additional masking step may be performed to open bond pads to the CMUT control chip 104. Therefore, as illustrated and described, the completed CMUT is formed directly on top of a semiconductor die that comprises the control circuitry (i.e., the CMUT control chip 104) for the CMUT. As a result, the problem of making electrical contact to the CMUT capacitor plates (i.e., the bottom electrode layer 116 and the top electrode layer 130) is simplified, and the control chip 104 and the CMUT sensor (i.e., the Epi silicon layer 122) may be integrated into a single package.

FIG. 2 is a flow diagram illustrating a method 200 for forming a CMUT on a semiconductor wafer in accordance with one embodiment of this disclosure. Initially, a CMUT control chip 104 is formed in or over a CMUT control chip device wafer 102 (step 202). The metal layer 106 is deposited over the CMUT control chip 104 (step 204). The metal layer 106 is patterned and etched to form top and bottom plate couplers 106a-106b (step 206). In this way, the CMUT control chip 104 is formed along with the connectors for coupling the CMUT control chip 104 to CMUT capacitor plates.

The passivation oxide layer 108 is formed over the top and bottom plate couplers 106a-106b and the CMUT control chip 104 (step 208). The passivation nitride layer 110 is formed over the passivation oxide layer 108 (step 210). The passivation oxide layer 108 and the passivation nitride layer 110 are patterned and etched to form the vias 112 (step 212). Conductive plugs 114, such as tungsten plugs, are formed in the vias 112 (step 214). A bottom electrode layer 116 is formed over the passivation nitride layer 110 and the conductive plugs 114 (step 216). The bottom electrode layer 116 is patterned and etched to form a larger portion representing the bottom electrode plate of the capacitor and a smaller portion (step 218). Thus, a first plate of the CMUT capacitor is formed in electrical contact with the CMUT control chip 104 through one of the plugs 114 and the bottom plate coupler 106*a*.

The oxide layer 118 is formed over the bottom electrode layer 116 and the passivation nitride layer 110 (step 220). The oxide layer 118 is patterned and etched to form oxide features 118*a*-118*b* (step 222). The oxide features 118*a*-118*b* are planarized (step 224).

The SOI wafer 120 is bonded to the planarized oxide layer 118 (step 226). The silicon layer 126 and the buried oxide layer 124 are removed, leaving the single crystal Epi silicon layer 122 (step 228). The Epi silicon layer 122 is patterned and etched to form the via 128 through the Epi silicon layer 122 and the oxide layer 118 (step 230). The top electrode layer 130 is formed over the Epi silicon layer 122 and in the via 128 (step 232). Thus, a second plate of the CMUT capacitor is formed in electrical contact with the CMUT control chip 104 through the smaller portion of the bottom electrode layer 116, another of the plugs 114, and the top plate coupler 106*b*. As described above, this approach supports both stand alone CMUT devices and the integration of the CMUT on the support circuitry.

It may be advantageous to set forth definitions of certain words and phrases that have been used within this patent document. The term "couple" and its derivatives refer to any direct or indirect communication between two or more components, whether or not those components are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The term "each" means every one of at least a subset of the identified items. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   forming oxide features over a capacitive micromachined ultrasonic transducer (CMUT) control chip that is in or over a silicon wafer, the CMUT control chip configured to control a capacitive micromachined ultrasonic transducer;
   planarizing the oxide features;
   bonding a silicon-on-insulator (SOI) wafer to the planarized oxide features;
   depositing a first metal layer over the silicon wafer and the CMUT control chip, wherein the first metal layer forms first and second plate couplers in electrical contact with the CMUT control chip;
   depositing a second metal layer over the first metal layer, wherein the second metal layer forms a first plate of a CMUT capacitor, wherein the first plate is in electrical contact with the first plate coupler; and
   depositing a third metal layer over the second metal layer, wherein the third metal layer forms a second plate of the CMUT capacitor, wherein the second plate is in electrical contact with the second plate coupler.

2. The method of claim 1, wherein at least some of the planarized oxide features are disposed between the first and second plates of the CMUT capacitor.

3. The method of claim 1, further comprising:
   forming a passivation oxide layer and a passivation nitride layer over the first and second plate couplers prior to depositing the second and third metal layers.

4. The method of claim 3, further comprising:
   fixating first and second vias through the passivation nitride layer and the passivation oxide layer to the first and second plate couplers, respectively; and
   forming first and second conductive plugs in the vias;
   wherein the first plate of the CMUT capacitor is formed in electrical contact with the first conductive plug; and
   wherein the second plate of the CMUT capacitor is formed in electrical contact with the second conductive plug.

5. The method of claim 1, further comprising:
   forming an oxide layer over the second metal layer;
   wherein forming the oxide features comprises patterning the oxide layer.

6. The method of claim 1, wherein:
   the SOI wafer comprises a single crystal silicon layer, a buried oxide layer, and a silicon layer;
   bonding the SOI wafer to the planarized oxide features comprises bonding the single crystal silicon layer to the planarized oxide features; and
   the method further comprises removing the silicon layer and the buried oxide layer of the SOI wafer, wherein the single crystal silicon layer remains bonded to the planarized oxide features.

7. The method of claim 6, wherein:
   the second metal layer also forms an additional conductive portion separate from the first plate of the CMUT capacitor, the additional conductive portion in electrical contact with the second plate coupler; and
   the method further comprises etching a via through the single crystal silicon layer to expose the additional conductive portion.

8. The method of claim 7, wherein depositing the third metal layer comprises depositing the third metal layer over the single crystal silicon layer and in the via.

9. A method comprising:
   forming oxide features over a capacitive micromachined ultrasonic transducer (CMUT) control chip that is in or over a silicon wafer, the CMUT control chip configured to control a capacitive micromachined ultrasonic transducer;
   fly cutting the oxide features to planarize the oxide features;
   bonding a single crystal silicon layer of a silicon-on-insulator (SOI) wafer to the planarized oxide features, wherein the SOI wafer comprises the single crystal silicon layer, a buried oxide layer, and a silicon layer;
   forming first and second plate couplers over the silicon wafer and in electrical contact with the CMUT control chip;
   forming a first plate of a CMUT capacitor over the first and second plate couplers, wherein the first plate is in electrical contact with the first plate coupler; and
   forming a second plate of the CMUT capacitor over the first plate, wherein the second plate is in electrical contact with the second plate coupler.

10. The method of claim 9, wherein at least some of the planarized oxide features are disposed between the first and second plates of the CMUT capacitor.

11. The method of claim 9, wherein forming the first and second plate couplers comprises:
   depositing a metal layer over the silicon wafer and the CMUT control chip; and
   etching the metal layer to form the first and second plate couplers.

12. The method of claim 11, further comprising:
   forming a passivation oxide layer and a passivation nitride layer over the first and second plate couplers;
   forming first and second vias through the passivation nitride layer and the passivation oxide layer to the first and second plate couplers, respectively; and
   forming first and second conductive plugs in the vias;
   wherein the first plate of the CMUT capacitor is formed in electrical contact with the first conductive plug; and
   wherein the second plate of the CMUT capacitor is formed in electrical contact with the second conductive plug.

13. The method of claim 12, wherein forming the first plate of the CMUT capacitor comprises depositing a second metal layer over the passivation nitride layer.

14. The method of claim 13, further comprising:
   removing the silicon layer and the buried oxide layer of the SOI wafer, wherein the single crystal silicon layer remains bonded to the planarized oxide features.

15. The method of claim 14, wherein:
   forming the first plate of the CMUT capacitor comprises forming an additional conductive portion separate from the first plate of the CMUT capacitor, the additional conductive portion in electrical contact with the second plate coupler; and
   the method further comprises etching a third via through the single crystal silicon layer to expose the additional conductive portion.

16. The method of claim 15, wherein forming the second plate of the CMUT capacitor comprises depositing a third metal layer over the single crystal silicon layer and in the third via.

17. The method of claim 9, further comprising:
   forming the CMUT control chip in or over the silicon wafer.

18. A method comprising:
   forming first and second plate couplers over a capacitive micromachined ultrasonic transducer (CMUT) control chip, the CMUT control chip configured to control a capacitive micromachined ultrasonic transducer;
   forming a first plate of a CMUT capacitor over the first and second plate couplers, wherein the first plate is in electrical contact with the first plate coupler;
   forming one or more oxide features over the first plate;
   planarizing the one or more oxide features;
   bonding a single crystal silicon layer of a silicon-on-insulator (SOI) wafer to the one or more planarized oxide features, wherein the SOI wafer comprises the single crystal silicon layer, a buried oxide layer, and a silicon layer;
   removing the silicon layer and the buried oxide layer of the SOI wafer, wherein the single crystal silicon layer remains bonded to the one or more planarized oxide features; and
   forming a second plate of the CMUT capacitor over the single crystal silicon layer, wherein the second plate is in electrical contact with the second plate coupler.

19. The method of claim 18, further comprising:
   forming at least one passivation layer over the first and second plate couplers prior to forming the first and second plates;
   forming first and second vias through the at least one passivation layer to the first and second plate couplers, respectively; and
   forming first and second conductive plugs in the vias;
   wherein the first plate is in electrical contact with the first conductive plug; and
   wherein the second plate is in electrical contact with the second conductive plug.

20. The method of claim 19, further comprising:
   etching a third via through the single crystal silicon layer;
   wherein forming the second plate comprises depositing conductive material over the single crystal silicon layer and within the third via.

* * * * *